United States Patent
Bhatia

[19]

[11] Patent Number: 6,094,919
[45] Date of Patent: Aug. 1, 2000

[54] PACKAGE WITH INTEGRATED THERMOELECTRIC MODULE FOR COOLING OF INTEGRATED CIRCUITS

[75] Inventor: Rakesh Bhatia, San Jose, Calif.

[73] Assignee: Intel Corporation, Santa Clara, Calif.

[21] Appl. No.: 09/225,252

[22] Filed: Jan. 4, 1999

[51] Int. Cl.[7] .................................................. F25B 21/02
[52] U.S. Cl. ............................... 62/3.7; 62/3.2; 62/259.2; 165/104.21
[58] Field of Search .................................. 62/3.7, 259.2, 62/3.2; 165/104.21

[56] References Cited

U.S. PATENT DOCUMENTS

| | | | |
|---|---|---|---|
| 5,032,897 | 7/1991 | Mansuria et al. ............................ | 357/81 |
| 5,220,171 | 6/1993 | Hara et al. ........................... | 62/259.2 X |
| 5,724,818 | 3/1998 | Iwata et al. ................................. | 62/3.7 |
| 5,918,469 | 7/1999 | Cardella ...................................... | 62/3.7 |
| 5,960,866 | 10/1999 | Kimura et al. .................. | 165/104.21 X |

FOREIGN PATENT DOCUMENTS 407202094   8/1995   Japan .

*Primary Examiner*—Henry Bennett
*Assistant Examiner*—Chen-Wen Jiang
*Attorney, Agent, or Firm*—Blakely, Sokoloff, Taylor & Zafman LLP

[57] ABSTRACT

A package for an integrated circuit (IC) comprises a lid attached to a base, with the IC being disposed in a space or cavity between the lid and the base. A thermoelectric module (TEM) having first and second primary surfaces is incorporated into a section of the lid. The first primary surface is thermally coupled to the IC such that application of power to the TEM causes heat to be transferred away from the IC.

26 Claims, 4 Drawing Sheets

PACKAGE WITH INTEGRATED THERMOELECTRIC MODULE FOR COOLING OF INTEGRATED CIRCUITS

RELATED APPLICATIONS

This application is related to co-pending application: Ser. No. 08/844,769, filed Apr. 22, 1997, entitled, "Method And Apparatus For Cooling Integrated Circuits Using A Thermoelectric Module"; which application is assigned to the assignee of the present application.

FIELD OF THE INVENTION

The present invention relates generally to the field of integrated circuits; more specifically, to methods and apparatus for cooling chip circuitry utilizing thermoelectric modules.

BACKGROUND OF THE INVENTION

Advances in integrated circuit technology have led to faster clock frequencies and greater densities of transistors. These advances have resulted in a corresponding increase in the amount of heat generated by the integrated circuits (ICs). With large amounts of heat being generated, the problem of efficient heat dissipation has received increased attention.

Typically, either active or passive devices cool ICs and printed circuits boards (PCBs). An active cooling device is one that introduces additional power into the system being cooled, whereas a passive device does not introduce additional power. An example of a passive cooling device is a heat sink mounted onto an integrated circuit package. As is well known, passive cooling devices have a limited capacity to dissipate heat.

An active cooling device, on the other hand, can dissipate larger amounts of heat. An example of a simple active cooling device is a fan that blows air across a heat sink and/or an IC package body. But even though active cooling devices tend to work better than their passive counterparts, heat dissipation capacity is still limited. This means that for newer ICs and PCBs, which generate more heat, ever-larger heat sinks and greater airflow rates are required.

A recently introduced type of active cooling device is based upon the scientific principle known as the Peltier effect, first discovered in 1834. In the Peltier effect, current passing through the junction of two different types of conductors causes a temperature change across the junction. Modern active cooling devices have been built which utilize the Peltier effect to operate as a thermoelectric cooler. A typical thermoelectric cooling device comprises a number of P-type and N-type semiconductors that are connected electrically in series and sandwiched between two plates. Bismuth telluride is primarily used as the semiconductive material. When connected to a DC power source, the current causes heat to move from one plate of the thermoelectric cooler to the other. Naturally, this creates hot and cool plate sides of the thermoelectric cooler. An example of a thermoelectric cooling device for use with an integrated circuit package is described in U.S. Pat. No. 5,032,897 of Mansuria, et al.

FIG. 1 illustrates a thermoelectrically cooled integrated circuit package as disclosed in the Mansuria patent. Referring to FIG. 1, integrated circuit package 10 consists of an IC 14 connected to chip carrier module 13 via thermoelectric cooler 16. A thermoconductive layer 12 connects the module 13 to a heat sink 11. Input/output (I/O) pins 17 provide electrical connection via integrated circuit 14 of the bonding wires 20. In addition, conductors 18 and 19 provide power to thermoelectric cooler 16. The cavity that encloses the IC 14 within module 13 is hermetically sealed by lid 15.

When a DC voltage is applied via conductors 18 and 19 to thermoelectric cooler 16, heat is transferred from integrated circuit 14 to chip carrier module 13. The heat transferred to module 13 is then dissipated into the surrounding environment via heat sink 11.

One of the limitations of the prior art system shown in FIG. 1 is the difficulty of implementation, particularly at the manufacturing level. In particular, mounting of integrated circuit 14 to a wall of the chip carrier module cavity via thermoelectric cooler 16 must be performed by the semiconductor manufacturer. Generally speaking, this imposes a requirement that each module 13 be manufactured to include a heat sink 11 attached to the chip carrier module, as shown in FIG. 1. Thus, the original equipment manufacturer (OEM), or anyone else involved in assembling package 10 into a larger system, lacks the ability of selectively controlling IC temperature. In many instances, the package of FIG. 1 limits the overall cooling design at the system level.

It is desirable to be able to selectively control the temperature of ICs assembled onto a printed circuit board in a way that provides design flexibility to the OEM or board manufacturers. Such a system would result in lower cost and more efficient heat dissipation, especially at the system level.

SUMMARY OF THE INVENTION

The present invention provides a package for an integrated circuit (IC) which is inexpensive and allows the IC to operate at significantly reduced temperatures. In one embodiment, the invention comprises a lid attached to a base. The IC is disposed in a space or cavity between the lid and the base. A thermoelectric module (TEM) is incorporated into a section of the lid. The TEM has first and second primary surfaces, with the first primary surface being thermally coupled to the IC such that application of power to the TEM causes heat generated by the IC to be transferred from the first primary surface to the second primary surface, thereby cooling the IC.

BRIEF DESCRIPTION OF THE DRAWINGS

The present invention is illustrated by way of example, and not by way of limitation, in the figures of the accompanying drawings, where.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention. Accordingly, the specification and drawings are to be regarded in an illustrative, rather than a restrictive, sense.

Figure 1:
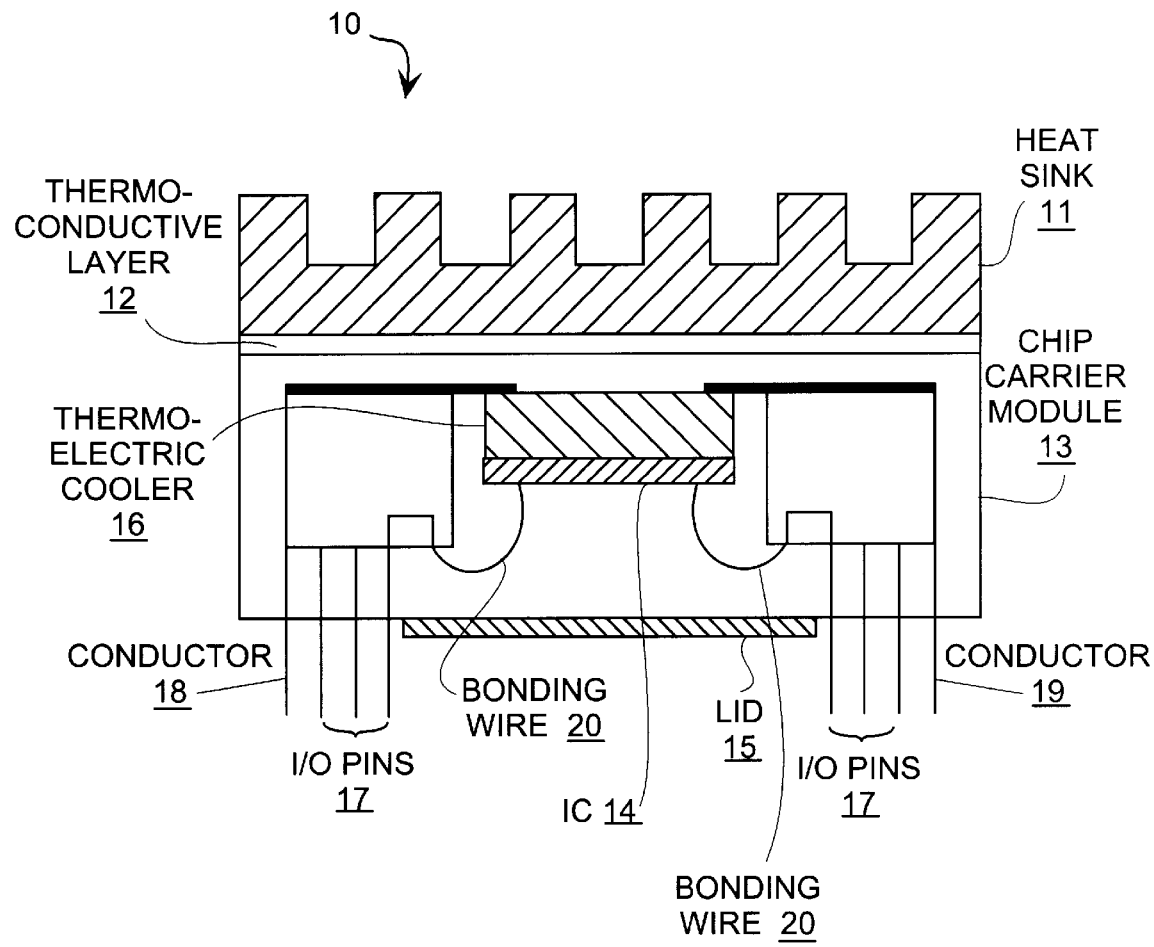
FIG. 1 is a prior art thermoelectrically cooled integrated circuit package.
Figure 2:
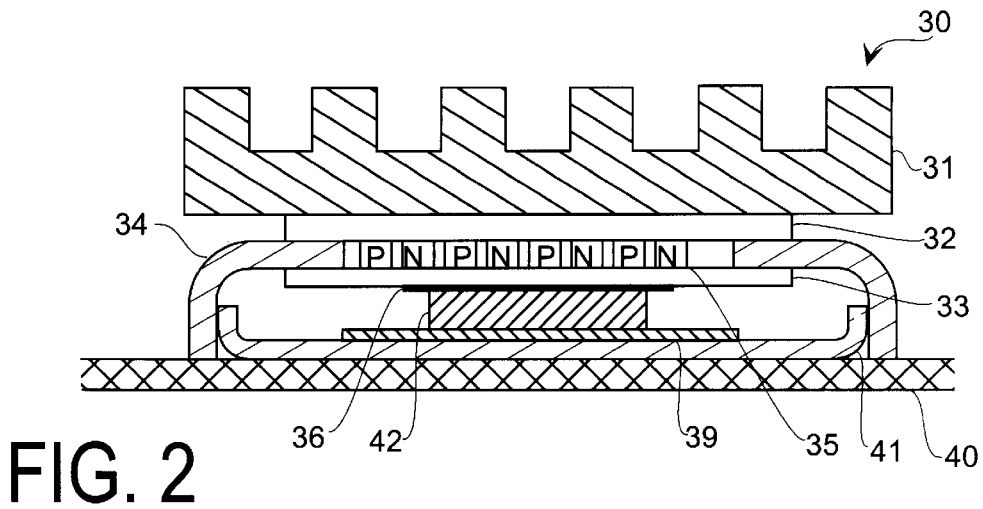
FIG. 2 is a cross-sectional view of an integrated circuit package in accordance with one embodiment of the present invention.

Referring now to FIG. 2, there is shown a cross-sectional view of an integrated circuit package 30 in accordance with one embodiment of the present invention. The invention of FIG. 2 comprises a thermoelectric module (TEM) 35 that is incorporated into lid 34. TEM 35 is constructed of P-type and N-type semiconductor material, in which the P and N type elements are connected alternately, electrically in series and thermally in parallel. Bismuth telluride is a material that may be utilized in the construction of TEM 35.

Surrounding TEM 35 is a top ceramic layer 32 and a bottom ceramic layer 33, both of which are attached to lid 34. In other words, according to the embodiment illustrated in FIG. 2 the semiconductor material of TEM 35 is sandwiched in-between ceramic layers 32 and 33 so as to incorporate the semiconductor elements of TEM 35 into an opening of lid 34. Note that the ceramic layers and semiconductor elements may be attached to lid 34 in a conventional manner. That is, using ordinary adhesives or other bonding agents.

Integrated circuit 42 is positioned in thermal and physical contact with ceramic layer 33 so as to provide efficient cooling when power is supplied to module 35. As shown in FIG. 2, one way of establishing adequate thermal contact with layer 33 is through a thermal grease layer 36. Power is provided to the semiconductor elements of module 35 via wires (not shown) that provide current through the semiconductor elements in accordance with the Peltier effect. This current flow causes heat generated by IC 42 to be transferred from bottom ceramic layer 33 to top ceramic layer 32. Heat sink 31 is attached to ceramic layer 32 to dissipate heat into the ambient surrounding atmosphere.

Placing TEM module 35 directly on top of IC 42 results in the IC being cooled at the expense of power supplied to module 35. Of course, the top surface of module 35 (layer 32) removes heat from integrated circuit 42, with heat sink 31 dissipating heat into the surrounding environment. Typically, heat sink 31 is utilized in conjunction with the cooling fan that facilitates efficient dissipation of heat from the top of the module.

Supporting IC 42 on the underside is a substrate 39, which, in turn, is supported by a bottom cover 41. Bottom cover 41 and lid 34 are both attached to circuit board 40 not shown in the illustrated embodiment. By way of example, circuit board 40 may comprise a motherboard or other system board providing support and interconnection between many ICs of a computer system. Electrical connection between IC 42 and board 40 may be achieved according to any one of a number of different conventional methods. For example, IC 42 may be electrically coupled to board 40 via pins (not shown) disposed in substrate 39, which pins pass through insulated holes in bottom cover 41.

Figure 4:
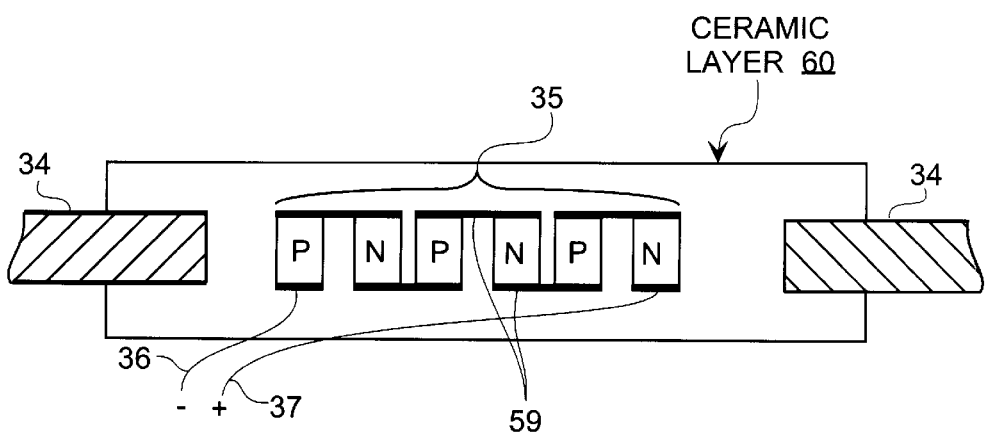
FIG. 4 shows another embodiment of the present invention in which a remotely located thermoelectric module is utilized to cool multiple integrated circuits.

Preferably, lid 34 comprises a body composed of a rigid material such as metal or plastic, with the section that incorporates TEM 35 including a ceramic layer insulating the PN junctions from the body. FIG. 4 illustrates one possible implementation of this aspect of the present invention. Thermoelectric module 35 is shown encased in a ceramic layer 60 that is integral with lid 34. Note that in FIG. 4, conductors 59 provide electrical connection between the P and N type semiconductor elements of TEM 35. Wires 36 and 37 are coupled to a DC power supply to effectuate electrical cooling via the Peltier effect. As mentioned previously, pins may be connected to wires 36 and 37 for the DC current needed to operate TEM 35.

Practitioners in the art will appreciate that the P and N junctions in FIG. 4 represent the semiconductor material pairs. The surface of ceramic layer 60 beneath TEM 35 (which is in thermal and physical contact with IC 42) is much cooler than the top surface of ceramic layer 60. In this manner, the total heat from the package is removed—either using a heat sink and fan—or as described below in the additional embodiments.

Figure 3:
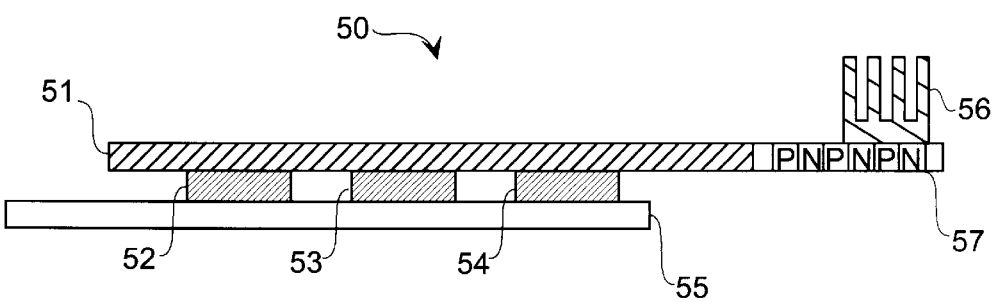
FIG. 3 illustrates one possible way of integrating a thermoelectric module into a package lid in accordance with the present invention.

Practitioners in the art will further appreciate that by integrating the TEM junctions into the lid, the ICs of a system can be made to run much cooler while providing greater flexibility in the cooling design at the board or system level. For example, FIG. 3 illustrates a computer cartridge 50 comprising integrated circuits 52, 53 and 54 mounted to a board 55. Lid 51 is in thermal contact with each of ICs 52–54. As can be seen, lid 51 includes a TEM 57; however, module 57 is not located directly above the respective ICs, but rather is located a remote distance from each of the ICs 52–54. Attached to the top of module 57 is a heat sink 56, which may be cooled by a fan for dissipating the heat generated by ICs 52–54. Ordinarily, lid 51 comprises a thermally conductive material such as a metal or metal alloy so that heat generated by each of the ICs is efficiently transferred to TEM module 57.

It should be understood that the embodiment of FIG. 3 provides important advantages over the prior art. First, by incorporating module 57 into the lid, the OEM or system manufacturer may configure the system in a way that maximizes efficient heat dissipation. For example, the heat sink and module 57 may be located in a cooler-surrounding, ambient environment than exists above board 55. Furthermore, additional modules 57 may be built into lid 51 at locations directly above one or more of the individual ICs 52–54. According to this embodiment of the invention, selective temperature control of the ICs is achieved.

Figure 5:
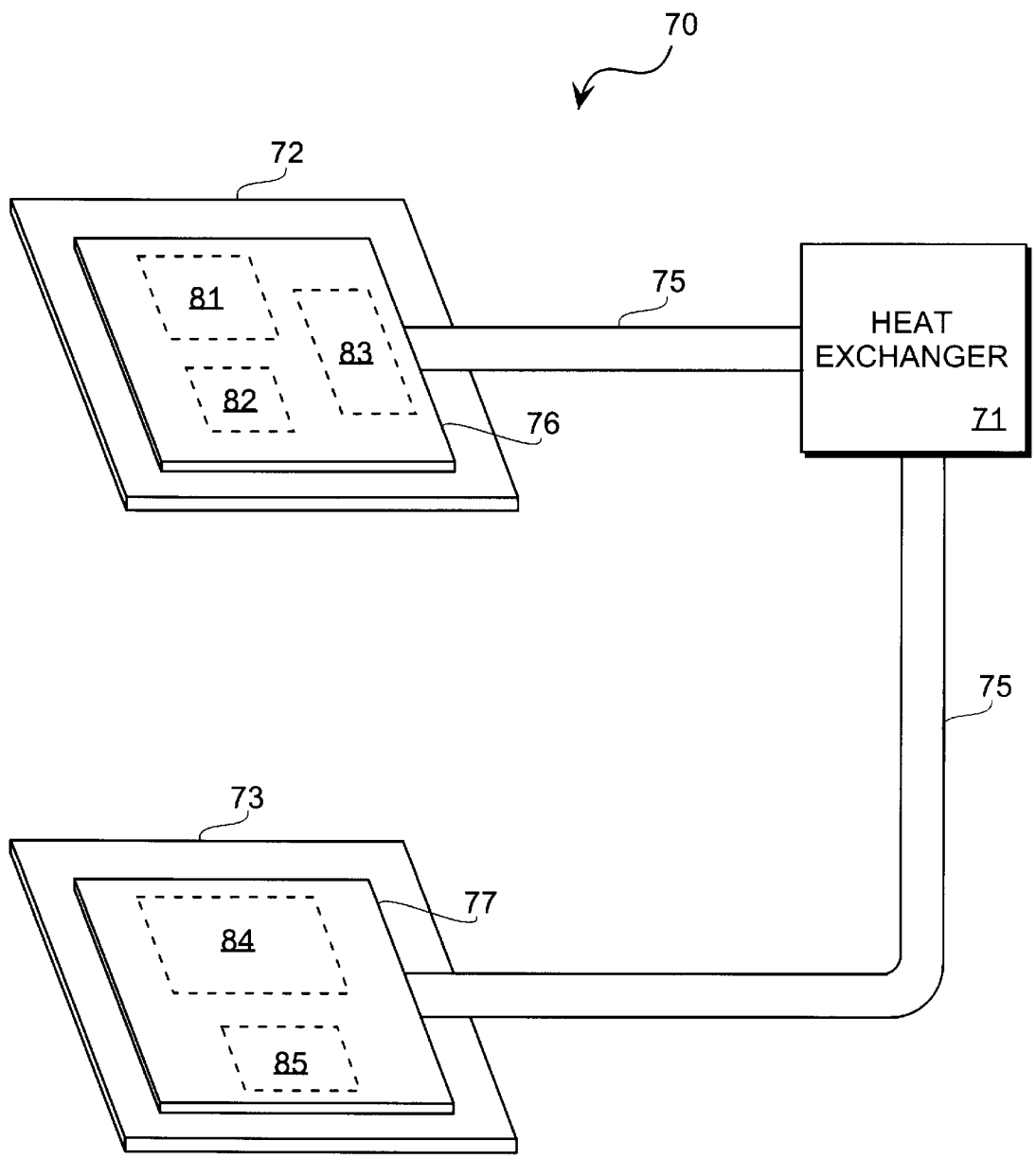
FIG. 5 is yet another embodiment of the present invention in which a remotely located thermoelectric module is utilized to cool chips mounted on several printed circuit boards or cards.

FIG. 5 shows another system configuration 70 comprising separate boards 72 and 73 having ICs 81–83 and 84–85 respectively mounted thereon. Lid 76 is in thermal contact with ICs 81–83, and lid 77 is in thermal contact with ICs 84 and 85. Heat pipes 75 are attached to lids 76 and 77 so as to transfer heat generated by the ICs to heat exchanger 71. In the example of FIG. 5, heat exchanger 71 may comprise a thermoelectric module as described above in conjunction with a heat sink, fan, etc.

In operation, heat generated by ICs 81–83 and 84–85 is removed by the combination of lids 76, 77, heat pipes 75 and heat exchanger 71. In this example, heat exchanger 71 is remotely located for optimal system cooling.

Figure 6:
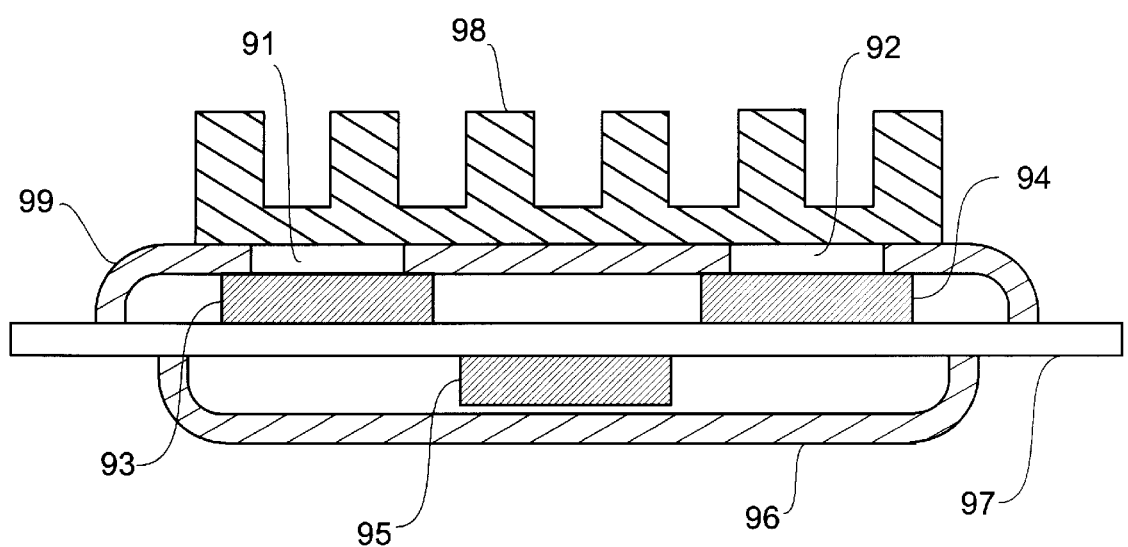
FIG. 6 is still another embodiment showing how the temperature of several integrated circuits may be controlled in accordance with the present invention.

FIG. 6 shows yet another embodiment of the present invention comprising ICs 93, 94 and 95 mounted on two sides of board 97. As shown, ICs 93 and 94 are mounted on the top side of board 97, with IC 95 being mounted on the bottom side of board 97. Lid 99 is attached to the top of board 97 and incorporates thermoelectric modules 91 and 92. Modules 91 and 92 are in thermal contact with ICs 93 and 94, respectively, in the same manner as described previously. On the opposite side of the board, IC 95 is disposed within a cavity defined by lid 96 and board 97. For this embodiment, IC 95 does not intimately contact lid 96, and lid 96 does not incorporate a thermoelectric module.

Heat sink 98 is attached to the top of lid 99 so as to dissipate heat generated by ICs 93 and 94 upon application of DC power to modules 91 and 92, respectively. Thus, the embodiment of FIG. 6 illustrates how the present invention may be utilized to selectively control the temperature of various integrated circuits of a larger computer system. Note also that this control is achieved at the system level by an integral combination of a thermoelectric module with a lid of a package (or board, cartridge, card, etc.).

I claim:

1. A package for an integrated circuit (IC) comprising:

a base to support the IC;

a lid attached to the base, the IC being disposed in a space between the lid and the base;

a thermoelectric module (TEM) incorporated into a section of the lid, the TEM having first and second primary surfaces with the first primary surface being thermally coupled to the IC such that application of power to the TEM causes heat generated by the IC to be transferred from the first primary surface to the second primary surface, thereby cooling the IC.

2. The package of claim 1 wherein the TEM comprises a plurality of p-n junctions coupled in series.

3. The package of claim 2 further comprising a heat sink mounted in thermal contact with the second primary surface.

4. The package of claim 2 wherein the lid comprises a body composed of a rigid material, with the section that incorporates the TEM including a ceramic layer insulating the p-n junctions from the body.

5. The package of claim 4 wherein the rigid material comprises a metal.

6. The package of claim 4 wherein the rigid material comprises a plastic.

7. The package of claim 4 wherein the section comprises an opening in the body.

8. The package of claim 1 wherein the base comprises:

a substrate on which the IC is mounted; and a bottom cover plate, the substrate being mounted on the bottom cover plate.

9. An integrated circuit (IC) package assembly comprising:

a substrate;

a plurality of ICs mounted on the substrate;

a lid having properties of thermal conductivity, the lid being attached to the substrate, with one or more of the ICs being in thermal contact with the lid;

a thermoelectric module (TEM) incorporated into a section of the lid, the TEM having a primary surface, application of power to the TEM causing heat generated by the one or more ICs to be transferred away from the primary surface;

a heat exchanger thermally coupled to the TEM to dissipate the heat generated by the one or more ICs.

10. The IC package assembly of claim 9 wherein the section is located a remote distance from the one or more ICs.

11. The IC package assembly of claim 10 wherein the lid comprises a body composed of a rigid material, with the section that incorporates the TEM including a plurality of p-n junctions encased in a ceramic layer.

12. The IC package assembly of claim 11 wherein the rigid material comprises a metal.

13. The IC package assembly of claim 10 wherein the section comprises an opening in the body.

14. The IC package assembly of claim 9 further comprising a heat pipe attached to the lid and TEM, the heat pipe transferring the heat generated by the one or more ICs from the lid to the TEM.

15. The IC package assembly of claim 9 wherein the substrate comprises a circuit board.

16. The IC package assembly of claim 15 wherein the one or more ICs comprise first and second ICs mounted on a top side of the circuit board, and a third IC mounted on a bottom side of the circuit board.

17. A package assembly for a computer system comprising:

first and second circuit boards, each circuit board having one or more ICs mounted thereon, and a lid mounted in thermal contact with the one or more ICs;

a heat exchanger that includes a heat sink and a thermoelectric module (TEM), application of power to the TEM causing heat generated by the one or more ICs to be dissipated by the heat sink; and first and second heat transfer elements for respectively transferring heat generated by the one or more ICs from the first and second circuit boards to the heat exchanger.

18. The package assembly of claim 17 wherein the first and second heat transfer elements each comprise a heat pipe coupled between the lid and the TEM.

19. The package assembly of claim 18 wherein the lid is metallic.

20. The package assembly of claim 17 wherein the heat exchanger is located a remote distance from the one or more ICs.

21. Apparatus for cooling electronic devices mounted on a circuit board comprising:

a lid having properties of thermal conductivity, the lid being attached to the substrate with one or more of the electronic devices being in thermal contact with the lid; and at least one thermoelectric module (TEM) incorporated into the lid, the at least one TEM having a primary surface, application of power to the at least one TEM causing heat generated by the one or more electronic devices to be transferred away from the primary surface.

22. The apparatus of claim 21 further comprising:

a heat exchanger thermally coupled to the at least one TEM to dissipate the heat generated by the one or more electronic devices.

23. The apparatus of claim 21 wherein the lid comprises a metal.

24. The apparatus of claim 21 wherein the at least one TEM includes a first TEM is disposed a remote distance from the one or more electronic devices.

25. The apparatus of claim 21 wherein the lid comprises a body composed of a rigid material with the at least one TEM comprising a plurality of p-n junctions.

26. The apparatus of claim 25 wherein the at least one TEM is encased in a ceramic layer.

* * * * *

UNITED STATES PATENT AND TRADEMARK OFFICE
CERTIFICATE OF CORRECTION

PATENT NO.   : 6,094,919
DATED        : August 1, 2000
INVENTOR(S)  : Bhatia

It is certified that error appears in the above-identified patent and that said Letters Patent is hereby corrected as shown below:

Column 1,
Line 67, delete "via", insert -- to --.
Line 67, delete "of", insert -- via --.

Column 3,
Line 49, delete "not", insert -- as --.

Signed and Sealed this

Fifth Day of November, 2002

Attest:

Attesting Officer

JAMES E. ROGAN
Director of the United States Patent and Trademark Office